United States Patent [19]
Iino et al.

[11] Patent Number: 4,904,883
[45] Date of Patent: Feb. 27, 1990

[54] SEMICONDUCTOR INTEGRATED CIRCUIT HAVING A DC TEST FUNCTION

[75] Inventors: Hideyuki Iino; Hidenori Hida, both of Yokohama, Japan

[73] Assignees: Fujitsu Limited; Fujitsu Microcomputer Systems Limited

[21] Appl. No.: 278,503

[22] Filed: Dec. 1, 1988

[30] Foreign Application Priority Data

Dec. 4, 1987 [JP] Japan .................. 62-307930

[51] Int. Cl.$^4$ .............. H03K 17/22; H03K 3/013; H03K 3/027; G01R 31/28
[52] U.S. Cl. .................. 307/272.3; 307/603; 307/296.5; 307/594; 307/272.1; 371/12; 371/22.5
[58] Field of Search ............. 307/465, 272.3, 465.1, 307/303, 303.1, 592, 597, 603, 296.5, 296.4, 482.1, 272.1; 371/12, 15, 25, 27

[56] References Cited

U.S. PATENT DOCUMENTS

| | | | |
|---|---|---|---|
| 4,410,991 | 10/1983 | Lenart ...................... | 371/12 X |
| 4,546,472 | 10/1985 | Volk et al. ................. | 371/15 |
| 4,551,841 | 11/1985 | Fujita et al. ............... | 307/594 X |
| 4,583,041 | 4/1986 | Kimura ...................... | 324/73 |
| 4,803,682 | 2/1989 | Harg et al. ................. | 371/12 |
| 4,843,592 | 6/1989 | Tsuaki et al. ............... | 371/12 X |

FOREIGN PATENT DOCUMENTS

202905 A3 11/1986 European Pat. Off. .
3725822 A1 2/1988 Fed. Rep. of Germany .

*Primary Examiner*—Stanley D. Miller
*Assistant Examiner*—David R. Bertelson
*Attorney, Agent, or Firm*—Armstrong, Nikaido, Marmelstein, Kubovcik & Murray

[57] ABSTRACT

An integrated circuit receiving an input signal and producing output signal including: a set/reset circuit, operatively connected to an internal main circuit, being set in response to the first signal and reset in response to the second signal in a normal mode; an output buffer circuit, connected to the set/reset circuit, for producing the output signal in response to an output of the set/reset circuit; and a control circuit, connected between the internal main circuit and the set/reset circuit, receiving the first signal, a reset signal for initializing the internal main circuit, the first signal, the second signal, and a first test signal, during a DC test mode, the control circuit resetting the set/reset circuit in response to a receipt of the reset signal regardless of the second signal and setting the set/reset circuit in response to a receipt of the first test signal regardless of the reset signal and the first signal.

3 Claims, 5 Drawing Sheets

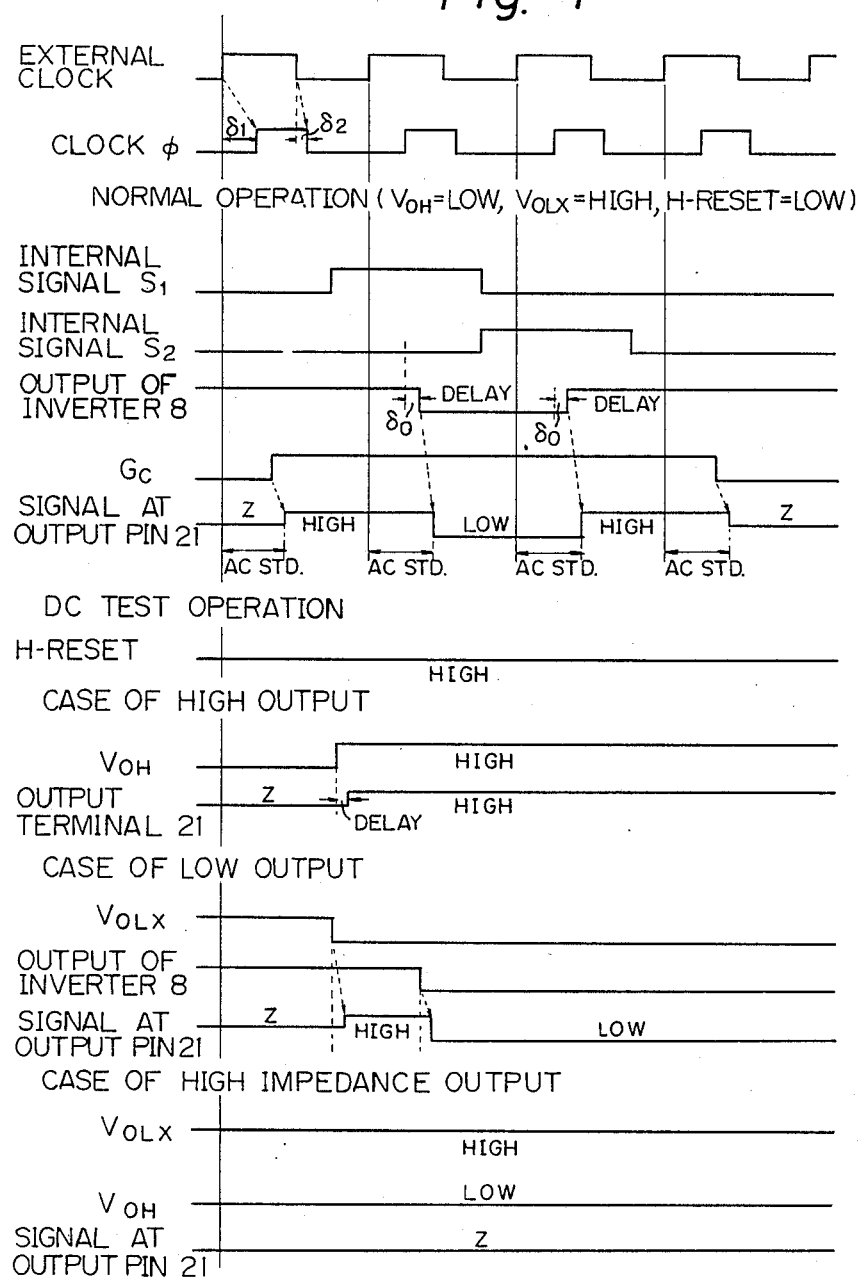

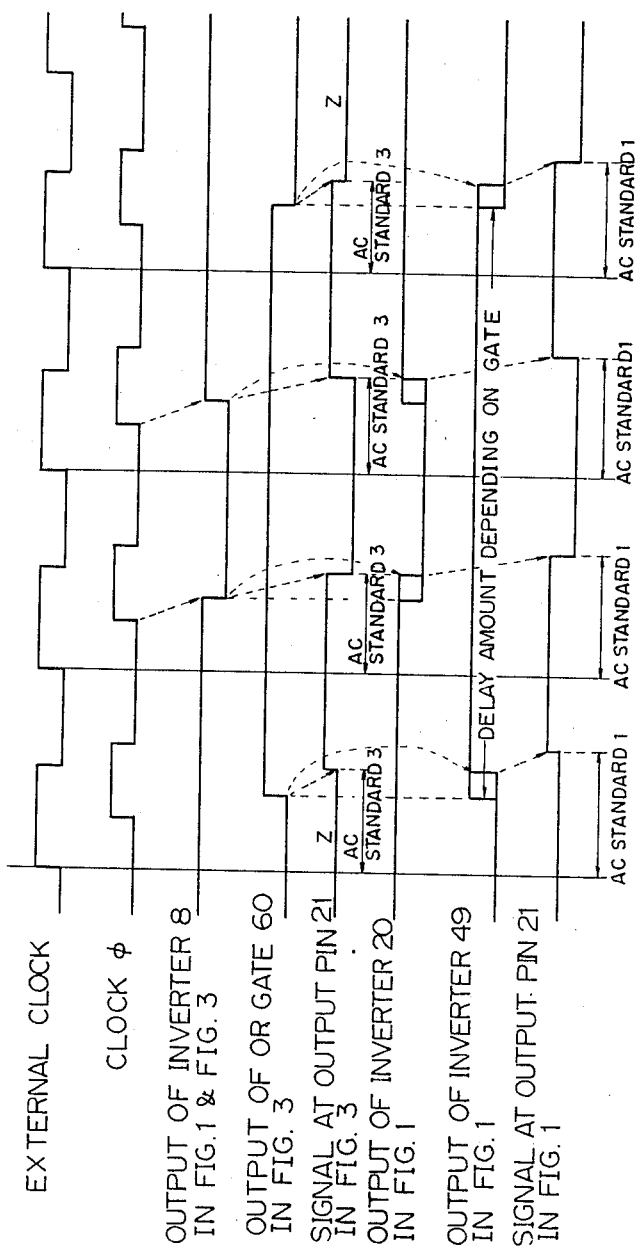

SEMICONDUCTOR INTEGRATED CIRCUIT HAVING A DC TEST FUNCTION

BACKGROUND OF THE INVENTION

1. Field of the Invention

The present invention relates to a semiconductor integrated circuit having a DC test function, and more particularly to a semiconductor integrated circuit able to test the DC characteristics without a deterioration of the AC characteristics.

2. Description of the Related Art

In general, a method of testing a large scale integrated circuit (LSI) device consists of inputting a test pattern or signal to an LSI device under test, comparing an output value from the LSI device to determine whether or not a function of the LSI device is faulty, and measuring analogue-values of an input/output voltage or current and the like.

A DC characteristic test and an AC characteristic test are used in the same way for a small scale integrated circuit (SSI) or a medium scale integrated circuit (MSI), based on the test method used for an LSI.

The DC characteristic test measures the voltage of external terminals, which are an input terminal and a power source terminal, of an LSI device or the DC current passing through the external terminals in a known DC testing method, and the AC characteristic test measures a propagation delay time between input/output terminals, a transition duration of the output waveform, a set-up time of the input waveform, a holding time, the minimum clock pulse width, and the maximum clock frequency or the like.

In the prior art large scale integrated circuit (LSI) device provided with a DC test circuit, a first test circuit and a second test circuit are arranged between an internal main circuit and an output buffer circuit, and the DC test of an LSI device is effected by utilizing these test circuits. But, in the conventional LSI device having the above structure, a deterioration of the AC characteristics occurs due to the delay caused by the DC test circuit.

One of the AC characteristics is a propagation delay time between an input terminal and an output terminal, and when a signal is applied to an input pin or terminal in synchronization with a predetermined clock signal, a delay of a signal output from an output pin can be measured by the AC test as a propagation delay time within an LSI device.

When the above-noted first test circuit and second test circuit are inserted, a signal is delayed when a signal is a passed through gates of the first and second test circuits; i.e., the signal delayed due to factors other than the essential function of the interior logic of the LSI device, and the AC characteristics are deteriorated. In these circumstances, a user may be given an impression of an essential AC characteristic of the LSI device as an unreliable electronic product, and thus further improvement is needed.

SUMMARY OF THE INVENTION

An object of the present invention is to provide a semiconductor integrated circuit device able to test the DC characteristics without the deterioration of the AC characteristics, by incorporating the DC test conditions into a hardware reset condition, a reset condition or the like produced from an internal logic block.

According to the present invention, there is provided an integrated circuit receiving an input signal and producing output signal including: an internal main circuit for carrying out various logic operations in accordance with the input signal and producing a first signal and second signal; a set/reset circuit, operatively connected to the internal main circuit, being set in response to the first signal and reset in response to the second signal in a normal mode; an output buffer circuit, connected to the set/reset circuit, for producing the output signal in response to an output of the set/reset circuit; and a control circuit, connected between the internal main circuit and the set/reset circuit, receiving the first signal, a reset signal for intializing the internal main circuit, the first signal, the second signal, and a first test signal, during a DC test mode, the control circuit reseting the set/reset circuit in response to a receipt of the reset signal regardless of the second signal and seting the set/reset circuit in response to a receipt of the first test signal regardless of the reset signal and the first signal.

In the circuit according to the present invention, a hardware-reset is effected prior to a DC test and a set/reset circuit is held at a reset state, an output buffer circuit at an initialization state, and further, a gate-ON signal is not output.

When a first DC test which brings an output pin or terminal to a LOW level state, is effected by applying a first test signal $V_{OLX}$, a signal equivalent to the set condition signal is supplied to the set/reset circuit and the output of the set/reset circuit is brought to a set state i.e. HIGH level, and on the other hand, a gate of the output buffer circuit is opened to bring the output pin to an LOW level state.

On one hand, when a second DC test which brings an output pin to a HIGH level state, is effected by applying a second test signal $V_{OH}$, a gate of the output buffer circuit is opened under a hardware-reset condition, a signal equivalent to the reset condition signal is input to the output buffer circuit, and the output pin is brought to a HIGH level state.

Accordingly, during either the first or second DC tests, a test signal is incorporated into one of a set condition and a reset condition, and therefore, a DC test circuit is not intervene there between and the AC characteristics of an LSI device are not deteriorated.

BRIEF DESCRIPTION OF THE DRAWINGS

FIG. 4 shows a waveforms of the signals of a normal operation and a DC operation of FIG. 3; and FIG. 5 shows a waveforms of the signals of the outputs of inverters 8, 20, 49 and a terminal 21 in FIGS. 1 and 3.

PREFERRED EMBODIMENTS OF THE INVENTION

Before describing the preferred embodiment, a prior art semiconductor integrated circuit will be described with reference to FIGS. 1 and 2.

One of the DC tests of an LSI chip forcibly brings an output pin under test to a logical HIGH level state, a logical LOW level state, or a high impedance (Z) state.

Figure 1:
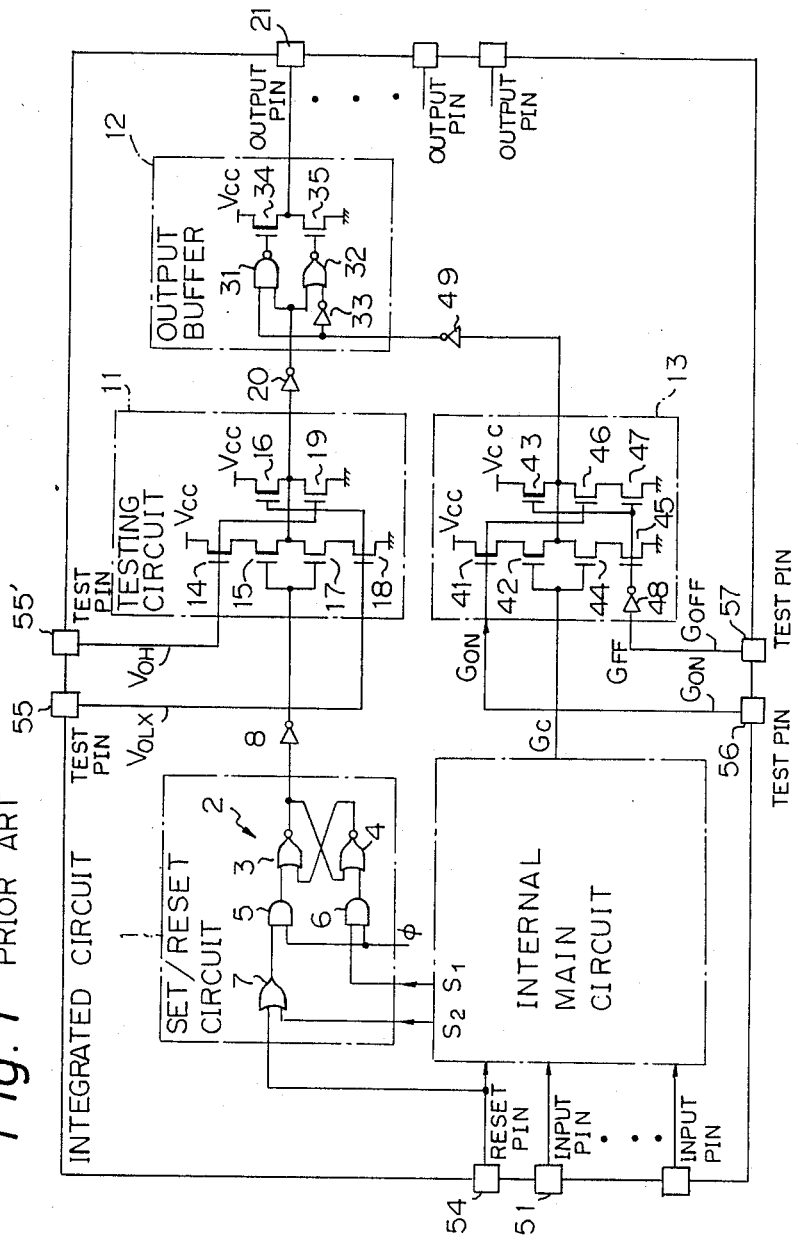
FIG. 1 is a circuit diagram showing a main part of a prior art semiconductor integrated circuit.

To carry out such a DC test, conventionally on LSI device in which a DC test circuit is provided, as shown in FIG. 1, for example.

The integrated circuit of FIG. 1 is constituted by an internal main circuit 52, a set/reset circuit 1, testing circuits 11 and 13, an output buffer 12, input pins 51, a reset pin 54, test pens 55, 55[1], 56, and 57, and output pines 21.

In FIG. 1, reference numeral 1 denotes a set/reset circuit constituted by NOR gates 1 and 4 which form a set/rest grip-flop 2, abbreviated as S-R FF, AND gates 5 and 6, and an OR gate 7.

An input signal is input to an internal main circuit 52 through input pins 51 and processed. Internal signals $S_1$ and $S_2$ as shown in FIG. 2, that is, the outputs of the internal main circuit 52 are output to output pins 21 through a set/reset circuit 1, a first testing circuit 11 and an output buffer 12. If the internal main circuit 52 is constituted by a set of complicated logic circuits, it takes too long to set a state of output pin 21 by an input signal given to at least one of input pins 51.

Thus, at a time of CD test, an output of an inverter 8 and a signal $G_C$ pass through a first testing circuits 11 and a second testing circuit 13 just as it is, respectively.

On the other hand, at a time of DC test, regardless of the state of the internal main circuit 52, the state of the output pins 21 can be brought to set to a HIGH state, a LOW state or a high impedance (Z) state. For example, all of output pins 21 can be set to a HIGH state, a LOW state or a high impedance state.

The S-R FF 2 is set by the internal signals $S_1$ and reset by the internal signal $S_2$. The internal main circuit 52 is initialized by the hardware reset signal H-RESET. The internal signal $S_2$ or the hardware reset signal (H-RESET) at a RESET PIN 54 is input to the AND gate 5 through the OR gate 7, and each of the above-noted signals is output to the S-R FF 2 in synchronization with a clock $\phi$.

On the other hand, the internal signal $S_1$ is input to the AND gate 6 and the internal signal $S_1$ also output to the S-R FF 2 in synchronization with the clock $\phi$.

An output of the set/reset circuit 1 is inverted by an inverter 8, the inverted signal is sent to an output buffer circuit 12 through a first test circuit 11, and further, an output of a second that circuit 13 is input to the output buffer circuit 12.

The first test circuit 11 is constituted by P-channel MOS transistors 14 to 16, referred to as PMOS hereinafter, and N-channel MOS transistors (NMOS) 17 to 19. A test signal $V_{OH}$, which denotes that HIGH is active, is input to gates of the PMOS 14, and NMOS 19 and a test signal $V_{OLX}$, which denotes that LOW is active, is input to gates of the NMOS 18 and PMOS 16. When the test signal $V_{OH}$ or $V_{OLX}$ is active, regardless of the level of the signal output from the set/reset circuit 1, an output terminal 21 of the LSI device is forcibly brought to a HIGH level state or a LOW level state to effect a DC test. The first test circuit 11 is a circuit which brings to set forcibly a state of the output pin 21 to a HIGH or LOW level state.

When a test signal $V_{OH}$ or $V_{OLX}$ is input, a first testing circuit 11, regardless of a signal output from the set/reset circuit 1, outputs an HIGH level or an LOW level signal to the output buffer circuit 12 through an inverter 20. The output buffer circuit 12 is formed by a NAND gate 31, a NOR gate 32, an inverter 33, a PMOS 34, and an NMOS 35, and buffer-amplifies an input signal to output same to an output terminal. The second testing circuit 13 is a circuit which brings to set forcibly a state of the output pin 21 to a high impedance state (Z).

On the other hand, a second test circuit 13 is formed by PMOS's 41 to 43, NMOS's 44 to 47, and an inverter 48, and a gate-ON signal G on is input to a gate of a PMOS 41, a gate control signal $G_C$ is input to each gate of a PMOS 42 and an NMOS 44, where both gates are connected to each other, and a gate-OFF signal $G_{OFF}$ is input to a gate of an NMOS 45 through an inverter 48. The second test circuit 13 controls the output buffer circuit 12, i.e., determines whether or not the output buffer circuit 12 is enabled.

In this case, signals $G_{ON}$ and $G_{OFF}$ are employed for a DC test and a signal $G_C$ is used during a normal operation. During a normal operation, i.e., when a DC test is not effected, the signals $G_{ON}$ and $G_{OFF}$ are in an LOW level state and only a signal $G_C$ is valid. The signal $G_C$ is a gate control signal during a normal operation, and when the signal $G_C$ is active, i.e. in a HIGH level active, i.e. in a HIGH level state, an output level of an inverter 20 appears at an output terminal 21 as it is. When the signal $G_C$ is inactive, i.e. in a LOW level state, the output pin 21 is in a high impedance state (Z) of a three-state condition.

During a DC test, when a signal $G_{OFF}$ becomes active, where HIGH is active, an output of inverter 49 is in a LOW level, and the output of inverter 49 is in a HIGH level state when the signal $G_{OFF}$ is in a LOW level state and $G_{ON}$ is in a HIGH level state. Namely, when the signal $G_{ON}$ is in a HIGH level state and the signal $G_{OFF}$ is in an LOW level state, a buffer function of the output buffer circuit 12 is active, and when the signal $G_{OFF}$ is in a HIGH state, the buffer function is inactive.

When the output buffer circuit 12 is active, an output of the inverter 20 appears directly at an output terminal 21, and when the output buffer circuit 12 is inactive, an output pin 21 is in a high impedance (Z) state.

Figure 2:
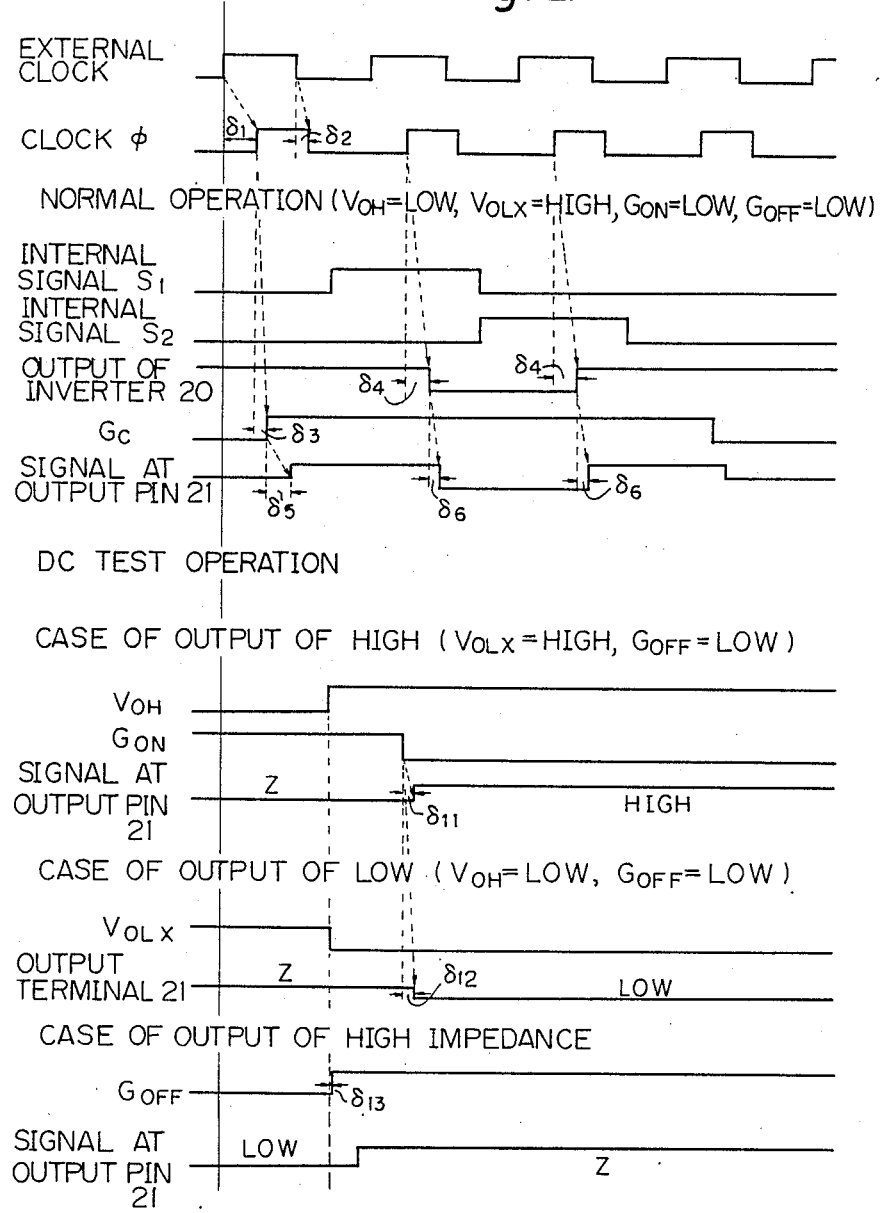
FIG. 2 is a timing chart of a normal operation and a DC operation of FIG. 1.

FIG. 2 shows the waveforms of the signals in a main parts of in FIG. 1. Based on the receipt of an external clock, a clock $\phi$ is produced with a time delay, and accordingly, a normal operation and a DC operation of the LSI device are carried out. An internal signal $S_1$ is followed by an internal signal $S_2$ and an output of an inverter 20 is delayed by a time delay $\delta_4$.

In FIG. 2, in a normal operation, the condition is as follow.

$V_{OH}$=LOW, $L_{OLX}$=HIGH $G_{ON}$=LOW, $G_{OFF}$=LOW

In response to the clock $\phi$, an internal signal $S_1$, an internal signal $S_2$, an output of an inverter 20, a gate control signal $G_C$, and a signal at an output terminal 21 are shown, respectively.

In a DC test operation, when a signal $V_{OLX}$ is in an HIGH level state and a gate-OFF signal $G_{OFF}$ is in a LOW a level state, the waveform of signals $V_{OH}$ and $G_{ON}$ and an output signal at an output terminal 21 are as shown as the first waveforms.

When a signal $V_{OH}$ is in an LOW level state, a signal $G_{OFF}$ is in an LOW level state and a signal $G_{ON}$ is the same as above, and the waveform of the signals $V_{OLX}$ and an output signal at a terminal 21 are shown as the second waveforms.

In a high impedance (Z) state, i.e. HIGH impedance, $G_{ON}$ is the same as above and the waveform of $G_{OFF}$ is slightly delayed at the leading edge, compared with that of the $V_{OLX}$. The output of an inverter 49 is in an LOW level state, and therefore, the output of the LSI device is in a high impedance (Z) state as shown in the third waveforms.

Figure 3:
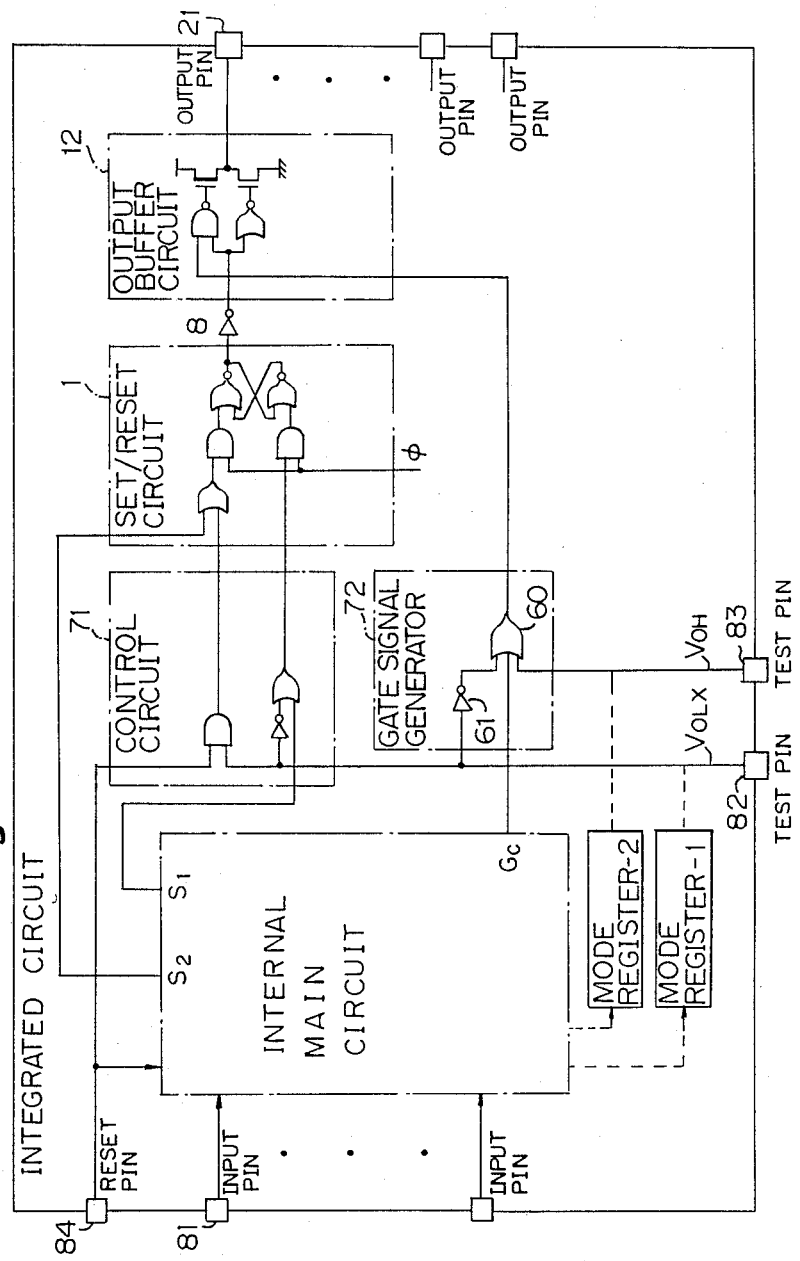
FIG. 3 is a circuit diagram showing an embodiment of an integrated circuit device in accordance with the present invention.

A semiconductor integrated circuit having a DC test function according to an embodiment of the present invention is shown in FIG. 3. The waveforms of the signals in the essential blocks in FIG. 3 are shown in FIG. 4.

In FIG. 3 an LSI device is constituted by an internal main circuit 52 (for example, a microprocessor, a PMA controller, a peripheral controller, etc.) output buffer 12, input pins 81, output pins 21, and test pins 81 and 83.

The output buffer 12 has a PMOS 34, a NMOS 35, a NAND gate 31, a NOR gate 32, and an inverter 33, the internal main circuit 52 carries out a variety of logical operations to deliver of setting and resetting condition signals to the output buffer, and on the other hand, is supplied with a hardware reset signal (H-RESET) signal from the reset pin 84 during a hardware resetting period.

In this case, setting or resetting is an operation in which the data is stored temporarily in register or the like in internal logic circuits and after a lapse of a predetermined time a HIGH-active signal synchronized with the clock signal $\phi$ is delivered. The hardware resetting is a resetting for forcibly resetting the logic circuit in the LSI device, for example, a resetting by an initialization. Normally, for a DC test, the hardware is reset to initialize all elements, and the DC test is started in this condition. The command signal for hardware resetting is H-RESET, which is supplied to the internal main circuit 52 and output buffer 52 from outside via the reset pin 84. Further, the internal main circuit 52 supplies a gate control signal $G_c$ to control the output buffer circuit 12. The gate control signal $G_c$ is effective when $V_{OLX}$ which is first DC test signal, and $V_{OH}$ which is second DC test signal are inactive in the condition shown in FIG. 3. On the other hand, the test pins 82 and 83 are provided to receive the first test signal $V_{OLX}$ and second test signal $V_{OH}$ when a DC test is carried out. Signals $V_{OLX}$ and $V_{OH}$ may be supplied from mode register-2 without providing test pins 82 and 83. The mode register-1 delivers signals $V_{OLX}$ and the mode register-1 and mode register-2 delivers signal $V_{OH}$ in accordance with commands from the internal main circuit 52.

As shown in FIG. 3, the internal signal $S_2$ is supplied from the internal main circuit 52 to the OR gate 7 to which an output from the AND gate 58 is supplied from the OR gate 7. The AND gate 58 is supplied with signals H-RESET and $V_{OLX}$, and allows the H-RESET signal which is HIGH-active to pass when the $V_{OLX}$ signal is at HIGH level. Namely, when the first DC test with the signal level at the output pin 21 at LOW level is not made (when $V_{OLX}$=HIGH), a hardware reset can be applied. The $V_{OLX}$ signal is inverted by the inverter 62 and supplied to the OR gate 59, and is supplied to the OR gate 60 through the inverter 61. The OR gate 59 is supplied with the internal signal $S_1$. This OR gate 59 will set the set/reset circuit 1 when internal signal $S_1$ or an LOW-active $V_{OLX}$ signal. The set/reset circuit 1 provides an HIGH-level signal when the setting internal signal $S_1$, is supplied or $V_{OLX}$ signal is at LOW level, and delivers an LOW-level signal when supplied with the internal signal $S_2$ or H-RESET signal. Therefore, the $V_{OLX}$ signal for a DC test is one of the signals input to the set/reset circuit 1. It should be noted that the set/reset circuit operation is based on the clock $\phi$. The above-mentioned AND gate 58, OR gate 59, and inverter 62 together form control circuit 71.

The output signal from the set/reset circuit 1 is supplied via the inverter 8 to the output buffer circuit 12, which buffer-amplifies the signal level of the set/reset circuit 1 and delivers an inverted level signal to the output pin 21. Further, the output buffer 12 is supplied with a signal from the OR gate 60 which is supplied with a test signal $V_{OH}$, gate control signal GATE ON condition and the output of the inverter 61. The gate control signal is such that unless a test is made, the gate of the output buffer 12 is opened to permit a normal signal from the set/reset circuit 1 to be passed. When a test is made, the gate control signal is not effective, so that the above-mentioned normal signal cannot be passed as it is.

Therefore, when an HIGH-level signal is delivered from the OR gate 60, the gates 31, 32 of the output buffer 12 are opened and the output level of the inverter 8 is passed as it is to the output pin 21. When an LOW-level signal is delivered from the OR gate 60, the gate of the output buffer 12 is closed so that the output pin 21 is at a high impedance (Z) level. The above-mentioned OR gate 60 and inverter 61 together form a gate signal generating means 72.

The operation of the LSI device of FIG. 3 will be described below.

First, the operation in the normal mode will be described.

When in the normal mode, test signals $V_{OH}$ is fixed in a LOW level state and $V_{OLX}$ is fixed in a HIGH level state. According to the internal logic of the internal main circuit 52 or a signal from the input pin 81, the LSI device 50 follows the normal logical request with the generation of a signal having a predetermined level. More particularly, the internal main circuit 52 generates the internal signals $S_1$ and $S_2$, and this command signal $S_1$ and $S_2$ are delivered to the set/reset circuit 1. On the other hand, the internal main circuit 52 supplies gate control signal $G_C$ to the OR gate 60. When the gate control signal $G_C$ becomes HIGH-active, the output buffer 12 permits the output signal from the inverter 8 to be passed. When an HIGH-active signal $S_2$ is delivered from the internal main circuit 52, this internal signal $S_2$ is is supplied to the AND gate 5 via the OR gate 7. Synchronously with the clock $\phi$, the AND gate 5 passes the HIGH-active internal signal $S_1$ from the OR gate 7 to the S-R FF 2 which, in turn, generates an LOW-level signal. This LOW-level signal is supplied through the inverter 8 to the output buffer 12. Thus, the NAND gate 31 is supplied with a HIGH-level signal, but since the NAND gate 31 is supplied with an HIGH-level signal as a GATE ON condition from the OR gate 60, the output from the NAND gate 31 is at LOW-level and the PMOS 34 is turned ON. Also, one of the input terminals of the NOR gate 32 is supplied with the HIGH-level signal from the inverter 8, and at the other terminal thereof, is supplied with an HIGH-level signal from the inverter 33, which has been inverted to LOW-Level by the inverter 33, so that the output is at LOW-Level and NMOS 35 is turned OFF. As a result, the output pin 21 is charged by a High-level power source $V_{cc}$ so that the output pin 21 is at HIGH level, i.e. HIGH-level signal is delivered. Thus, the output pin 21 is at HIGH- level for a resetting condition.

As another example, when the internal main circuit 52 delivers, for example, an HIGH-active internal signal $S_1$, the condition output is supplied through the OR gate 59 to the set/reset circuit 1 which, in turn, generates an HIGH-level signal in synchronization with the clock $\phi$ and delivers an LOW-level signal through the inverter 8 to the output buffer 12. Thus, according to the logic opposite to that for internal signal $S_2$, the output of the NAND gate 31 becomes HIGH and the output of the NOR gate 32 also becomes HIGH, so that the PMOS 34 is turned OFF and the NMOS 35 is turned ON. As a result, the potential at the output pin 21 drops to the ground potential, and thus the output pin 21 is at LOW-level, an LOW-level signal is delivered.

As a further example, the internal main circuit 52 commands a high impedance (Z), for example, as one of three states, from time to time. The condition in this case is such that a command is issued to prevent the GATE ON conditions from being effective when in the normal mode (namely, the signals $V_{OLX}$ and $V_{OH}$ are all inactive). Therefore, the GATE ON condition becomes inactive, i.e. LOW Level, so that all of the three signals input to the OR gate 60 are brought to the LOW-level and supplied to the output buffer 12. Thus, in the output circuit 12, the output from the NAND gate 31 is at HIGH level and the output from the NOR gate 32 is at LOW Level, regardless of the level of the signal from the inverter 8, so that both the PMOS 34 and NMOS 35 are turned OFF, with the result that the output pin 21 is at a high impedance (Z) level, at which the impedance is high. The AC test is made in such a normal condition to measure the propagation delay time between, for example, the aforementioned input and output pins or terminals, and the set-up time, and the like. Since an interposed test circuit is not provided, no delay of set-up occurs in response to a clock, which would occur if a test circuit is provided, and thus it is possible to avoid a degradation of the AC characteristics. The quality of the LSI devices can be thus improved for the users.

Second, the operation in the DC test mode will be described.

First, an external HIGH-active H-RESET signal is applied to the reset pin 74. At this time, the $V_{OLX}$ signal is HIGH-inactive while $V_{OH}$ signal is LOW-inactive, and the signal $G_C$ is LOW-inactive. Namely, all the signals are initialized to be inactive. When an H-RESET signal is applied, the internal logic of the internal main circuit 52 is reset to the initial state. On the other hand, the H-RESET signal is supplied via the AND gate 58 to the set/reset circuit 1, which will be reset, so that an HIGH-level signal is supplied to the output buffer 12. Thus, one of the input terminals of the NAND gate 31 and NOR gate 32, respectively, is at the HIGH-level. Since the output of the OR gate 60 is at the LOW-Level at this time, the other input terminal of the NAND gate 31 is also at the LOW-level and the other input terminal of the NOR gate 32 becomes HIGH. Hence, the output pin 21 has a high impedance as in the case of a high impedance (Z) as one of three states, i.e., an initialization is attained.

The DC test is made during the above-mentioned hardware resetting period. Namely, in the first DC test, an LOW-active $V_{OLX}$ signal is applied to the test pin 82. After inversion by the inverter 62 to the H level, this $V_{OLX}$ signal is delivered to the set/reset circuit 1 through the OR gage 59, and therefore, the set/reset circuit 1 is brought to a state as if it were supplied with an HIGH-level signal for a setting condition, and the output of this set/reset circuit 1 is at HIGH level and is supplied to the output buffer 12 through the inverter 8. On the other hand, an Low-level $V_{OLX}$ signal is applied to the AND gate 58 at this time so that the H-RESET signal cannot pass through the AND gate 58. Therefore, the setting and resetting conditions are simultaneously supplied to the set/reset circuit 1, and the set/reset circuit 1 will not oscillate. After coming to the HIGH level as inverted by the inverter 61, the $V_{OLX}$ signal is supplied to the output buffer 12 through the OR gate 60. Therefore, the gate of the output buffer 12 is opened so that the aforementioned LOW-level signal from the set/reset circuit 1 is accepted by the output buffer 12, the output of which, namely, the output pin 21 is at the LOW-level, and thus the first DC test is effected.

In the second DC test with the output pin 21 at the H level, an HIGH-active $V_{OH}$ signal is supplied to the test pin 83. This $V_{OH}$ siqnal is supplied to the output buffer 12 throuqh the OR qate 60 so that the signal levels at the other inputs of the NAND gate 31 and NOR gate 32, respectively, in the output buffer 12 are changed. Namely, the signal level at one of the inputs of the NAND gate 31 is HIGH and that at the other input is changed from LOW to HIGH, but the output of the NAND gate 31 is at LOW-Level. The signal level at one of the inputs of the NOR gate 32 is LOW and that at the other input is changed from LOW to HIGH, so that the output of the NOR gate 32 is changed from HIGH to LOW and the NMOS 35 is turned OFF. Thus, the output pin 21 is at the HIGH level, and the second DC test is made.

As described above, by supplying a $V_{OLX}$ signal when a first DC test is to be effected, the state wherein the set/reset circuit 1 is forcibly kept in the reset state by the hardware resetting signal H-RESET is cancelled, and due to this $V_{OLX}$ signal, a signal equivalent to the setting condition is supplied to the set/reset circuit 1. The output of the set/reset circuit 1 becomes HIGH, i.e. set state, and the gate of the output buffer 12 is opened to that the output of the output buffer 12 is at the LOW-level. Consequently, the $V_{OLX}$ signal is simply one of the conditions for setting the set/reset circuit 1, and since a test circuit is not included as in the prior art, between the set/reset circuit 1 and output buffer 12, the AC characteristics are not degraded.

By turning the $V_{OLX}$ signal OFF and the $V_{OH}$ signal ON when the second DC test is to be made, the gate of the output buffer 12 is opened in a state wherein the set/reset circuit 1 is in the reset condition due to the H-RESET signal, a signal equivalent to the internal signal $S_2$ is supplied to the output buffer 12, the output of which is at HIGH level. Therefore, the $V_{OH}$ signal is simply one of the gate control signals for the output buffer 12 and the AC characteristics will be degraded as in the above-mentioned case. As a result, the AC characteristics of the LSI device can be improved and the quality of the operation of the device can be enhanced.

When the signals $V_{OLX}$ and $V_{OH}$ are made inactive during a hardware resetting, a signal of a high impedance (Z) is obtained at the output pin 21.

FIG. 4 shows waveforms for illustrating a normal operation and a DC operation of FIG. 3.

In FIG. 4, if a series of external clocks and clocks $\phi$ are given, a normal operation and a DC operation are described responsive to them.

The normal operation is as follows.

$V_{OH}$=LOW, $V_{OLX}$=HIGH, H-RESET=LOW

If a SET condition signal and a RESET condition signal are given, the output of an inverter 8, a gate-ON condition signal and the output of terminal 21 are shown responsive to the SET and RESET signals. The output of the inverter 8 produces a predetermined time delay $\delta_O$ to a clock $\phi$. Further, responsive to the gate-ON condition signal, the output of the LSI output terminal 21 is shown as high impedance (Z), HIGH level (H), LOW level (L), HIGH level (H), high impedance (Z), and so on as shown in the figure in case of an AC standard.

If a H-RESET signal is given, HIGH and LOW outputs and high impedance output are obtained as follows.

(a) In the case of HIGH output $V_{OLX}$=HIGH,

From H-RESET and $V_{OLX}$, OR gate 7 is ON,
The output of an inverter 8 is HIGH, which is determined by an OR gate 60.

(b) In the case of LOW output $V_{OH}$=LOW,

The output of AND gate 58 is LOW, and RESET condition=LOW, OR gate 7 is not HIGH.

(c) In the case of high impedance (Z) output $V_{OLX}$=HIGH, $V_{OH}$=LOW,

The output of OR gate 60 is in a LOW state and the output buffer 12 is not active.

FIG. 5 shows waveforms for illustrating the outputs of the inverters 8, 20, 49 and the terminal 21 in FIGS. 1 and 3.

Responsive to a series of external clocks and clocks $\phi$, the outputs of the inverter 8 in FIG. 1 and FIG. 3, the output of the OR gate 60 in FIG. 3, the output of the terminal 21 in FIG. 3, the outputs of inverters 20 and 49 in FIG. 1 and the output of the terminal 21 in FIG. 1 are shown in the figure.

In FIG. 5, AC standard of FIG. 3 and FIG. 1 are shown, comparing the AC standard of FIG. 1 with that of FIG. 3, the delay of the signal at the output terminal of FIG. 1 being delayed by the amount of the DC test circuits and inverters.

We claim:

1. An integrated circuit receiving an input signal and producing output signal comprising:
   an internal main circuit for carrying out various logic operations in accordance with the input signal and producing a first signal and second signal;
   a set/reset circuit, operatively connected to said internal main circuit, being set in response to the first signal and reset in response to the second signal in a normal mode;
   an output buffer circuit, connected to said set/reset circuit, for producing the output signal in response to an output of said set/reset circuit; and
   a control circuit, connected between said internal main circuit and said set/reset circuit, receiving the first signal, a reset signal for initializing said internal main circuit, the first signal, the second signal, and a first test signal, during a DC test mode, said control circuit resetting said set/reset circuit in response to a receipt of the reset signal regardless of the second signal and setting said set/reset circuit in response to a receipt of the first test signal regardless of the reset signal and the first signal.

2. An integrated circuit according to claim 1, wherein said buffer circuit comprises a three state buffer circuit, and said internal main circuit produces a gate control signal to control the three state buffer circuit.

3. An integrated circuit according to claim 2, wherein said integrated circuit further comprises a gate signal generator, connected between said internal main circuit and the three state buffer circuit, receiving the gate control signal and a second test signal and making the three state buffer in active in response to a receipt of the second test signal regardless of the gate control signal during the DC test mode.

* * * * *

REEXAMINATION CERTIFICATE (1918th)
United States Patent [19]
Iino et al.

[11] B1 4,904,883
[45] Certificate Issued Feb. 2, 1993

[54] SEMICONDUCTOR INTEGRATED CIRCUIT HAVING A DC TEST FUNCTION

[75] Inventors: Hideyuki Iino; Hidenori Hida, both of Yokohama, Japan

[73] Assignees: Fujitsu Limited; Fujitsu Microcomputer Systems Limited, both of Kawasaki, Japan

Reexamination Request:
No. 90/002,554, Feb. 14, 1992

Reexamination Certificate for:
Patent No.: 4,904,883
Issued: Feb. 27, 1990
Appl. No.: 278,503
Filed: Dec. 1, 1988

[30] Foreign Application Priority Data
Dec. 4, 1987 [JP] Japan .................. 62-307930

[51] Int. Cl.⁵ .............. H03K 17/22; H03K 3/013; H03K 3/027; H03K 31/28
[52] U.S. Cl. ................ 307/272.3; 307/603; 307/296.5; 307/594; 307/272.1; 371/12; 371/22.5
[58] Field of Search ............ 307/272.3, 272.1; 371/22.1, 22.2, 22.5, 22.6; 324/158 R

[56] References Cited
U.S. PATENT DOCUMENTS
4,752,729  6/1988  Jackson et al. ............ 324/73

FOREIGN PATENT DOCUMENTS
62-50674  3/1987  Japan ............ 371/22.1

*Primary Examiner*—David R. Hudspeth

[57] ABSTRACT

An integrated circuit receiving an input signal and producing output signal including: a set/reset circuit, operatively connected to an internal main circuit, being set in response to the first signal and reset in response to the second signal in a normal mode; an output buffer circuit, connected to the set/reset circuit, for producing the output signal in response to an output of the set/reset circuit; and a control circuit, connected between the internal main circuit and the set/reset circuit, receiving the first signal, a reset signal for initializing the internal main circuit, the first signal, the second signal, and a first test signal, during a DC test mode, the control circuit resetting the set/reset circuit in response to a receipt of the reset signal regardless of the second signal and setting the set/reset circuit in response to a receipt of the first test signal regardless of the reset signal and the first signal.

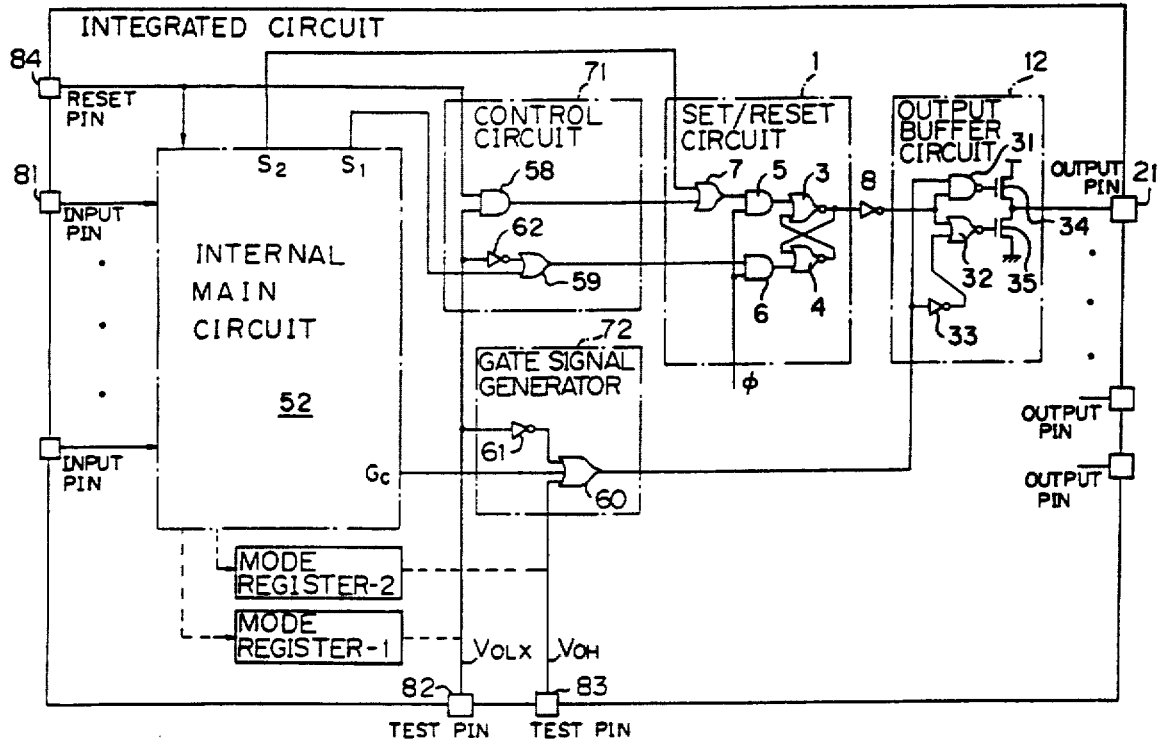

ized to be inactive. When an H-

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 5, lines 11–14:

In FIG. 3 an LSI device is constituted by an internal main circuit 52 (for example, a microprocessor, a PMA controller, a peripheral controller, etc.) output buffer 12, input pins 81, output pins 21, and test pins [81] *82* and 83.

Column 5, lines 23–48:

In this case, setting or resetting is an operation in which the data is stored temporarily in register or the like in internal logic circuits and after a lapse of a predetermined time a HIGH-active signal synchronized with the clock signal $\phi$ is delivered. The hardware resetting is a resetting for forcibly resetting the logic circuit in the LSI device, for example, a resetting by an initialization. Normally, for a DC test, the hardware is reset to initialize all elements, and the DC test is started in this condition. The command signal for hardware resetting is H-RESET, which is supplied to the internal main circuit 52 and output buffer [52] *12* from outside via the reset pin 84. Further, the internal main circuit 52 supplies a gate control signal $G_c$ to control the output buffer circuit 12. The gate control signal $G_c$ is effective when $V_{OLX}$ which is first DC test signal, and $V_{OH}$ which is second DC test signal are inactive in the condition shown in FIG. 3. On the other hand, the test pins 82 and 83 are provided to receive the first test signal $V_{OLX}$ and second test signal $V_{OH}$ when a DC test is carried out. Signals $V_{OLX}$ and $V_{OH}$ may be supplied from mode register-2 without providing test pins 82 and 83. The mode register-1 delivers signal $V_{OLX}$ and the mode register-1 and mode register-2 delivers signals $V_{OH}$ in accordance with commands from the internal main circuit 52.

Column 5, lines 49–68 through column 6, lines 1–4:

As shown in FIG. 3, the internal signal $S_2$ is supplied from the internal main circuit 52 to the OR gate 7 to which an output from the AND gate 58 is supplied [from] *to* the OR gate 7. The AND gate 58 is supplied with signals H-RESET and $V_{OLX}$, and allows the H-RESET signal which is HIGH-active to pass when the $V_{OLX}$ signal is at HIGH level. Namely, when the first DC test with the signal level at the output pin 21 at LOW level is not made (when $V_{OLX}$=HIGH), a hardware reset can be applied. The $V_{OLX}$ signal is inverted by the inverter 62 and supplied to the OR gate 59, and is supplied to the OR gate 60 through the inverter 61. The OR gate 59 is supplied with the internal signal $S_1$. This OR gate 59 will set the set/reset circuit 1 when internal signal $S_1$ or [an] *a* LOW-active $V_{OLX}$ signal. The set/reset circuit 1 provides an HIGH-level signal when the setting internal signal $S_1$ is supplied or $V_{OLX}$ signal is at LOW level, and delivers an LOW-level signal when supplied with the internal signal $S_2$ or H-RESET signal. Therefore, the $V_{OLX}$ signal for a DC test is one of the signals input to the set/reset circuit 1. It should be noted that the set/reset circuit operation is based on the clock $\phi$. The above-mentioned AND gate 58, OR gate 59, and inverter 62 together form control circuit 71.

Column 7, lines 42–60:

First, an external HIGH-active H-RESET signal is applied to the reset pin [74] *84*. At this time, the $V_{OLX}$ signal is HIGH-inactive while $V_{OH}$ is LOW-inactive, and the signal $G_c$ is LOW-inactive. Namely, all the signals are initialized to be inactive. When an H-RESET signal is applied, the internal logic of the internal main circuit 52 is reset to the initial state. On the other hand, the H-RESET signal is supplied via the AND gate 58 to the set/reset circuit 1, which will be reset, so that [an] *a* HIGH-level signal is supplied to the output buffer 12. Thus, one of the input terminals of the NAND gate 31 and NOR gate 32, respectively, is at the HIGH-level. Since the output of the OR gate 60 is at the LOW-Level at this time, the other input terminal of the NAND gate 31 is also at the LOW-level and the other input terminal of the NOR gate 32 becomes HIGH. Hence, the output pin 21 has a high impedance as in the case of a high impedance (Z) as one of three states, i.e., an initialization is attained.

The drawing figures have been changed as follows: An inverter symbol with connections, and reference numerals 3, 4, 5, 6, 7, 31, 32, 33, 34, 35, 52, 56, 59 and 62 have been added to FIG. 3.

AS A RESULT OF REEXAMINATION, IT HAS BEEN DETERMINED THAT:

The patentability of claims 1–3 is confirmed.

* * * * *